United States Patent [19]

Porter et al.

[11] 4,010,450
[45] Mar. 1, 1977

[54] FAIL SOFT MEMORY
[75] Inventors: Marion G. Porter, Phoenix; Garvin Wesley Patterson; Jaime Calle, both of Glendale, all of Ariz.
[73] Assignee: Honeywell Information Systems, Inc., Waltham, Mass.
[22] Filed: Mar. 26, 1975
[21] Appl. No.: 562,361
[52] U.S. Cl. .......................................... 340/172.5
[51] Int. Cl.[2] .................. G06F 11/04; G06F 13/06; G06F 9/16
[58] Field of Search ...................... 340/172.5; 445/1

[56] References Cited
UNITED STATES PATENTS

| 3,312,947 | 4/1967 | Raspanti | 340/172.5 |
|---|---|---|---|
| 3,434,116 | 3/1969 | Anacker | 340/172.5 |
| 3,436,734 | 4/1969 | Pomerene et al. | 340/172.5 |
| 3,444,526 | 5/1969 | Fletcher | 340/172.5 |
| 3,609,704 | 9/1971 | Schurter | 340/172.5 |
| 3,633,175 | 1/1972 | Harper | 340/172.5 |
| 3,668,644 | 6/1972 | Looschen | 340/172.5 |
| 3,737,870 | 6/1973 | Carter et al. | 340/172.5 |
| 3,771,143 | 11/1973 | Taylor | 340/172.5 |
| 3,771,146 | 11/1973 | Cotton et al. | 340/172.5 |
| 3,792,448 | 2/1974 | Bennett et al. | 340/172.5 |
| 3,905,023 | 9/1975 | Perpiglia | 340/172.5 |
| 3,934,227 | 1/1976 | Worst | 340/172.5 |
| 3,949,372 | 4/1976 | Brioschi | 340/172.5 |
| 3,976,977 | 8/1976 | Porter et al. | 340/172.5 |

Primary Examiner—Gareth D. Shaw
Assistant Examiner—Jan E. Rhoads
Attorney, Agent, or Firm—Nicholas Prasinos; Ronald T. Reiling

[57] ABSTRACT

A firmware/hardware mechanism in a general purpose computer system automatically provides alternate addressing paths for addressing data in the same or another main memory module when a failure is detected in a portion of the main memory or main memory module. Two types of memory failures are detected and an alternate path provided for each type of failure. The first type is a failure in a memory which is not detected by memory hardware or systen interface unit SIU hardware; such failure is handled by an exception processing mechanism to provide an alternate path to a good memory module. The second type of failure is detected by memory hardware or systen interface unit SIU hardware; such failure is handled by an interrupt processing mechanism to provide an alternate path to a good memory module.

15 Claims, 15 Drawing Figures

| PSR | STEERING | P | R | A | CC | C | PROCESS TIMER | 0 |
| --- | --- | --- | --- | --- | --- | --- | --- | --- |
| IC | L/R | S | | ADDRESS | | | | 1 |
| | | | | | | | | 2 |
| | | | | GR's | | | | 3 |
| PTBR | L/R | S | PROG # | PAGE TABLE BASE | | | KEY | n |

*FIG. 2A*

BIT 0      7 8  9 10 11 12 13 14                35
PSR | STEERING | P | R | A | CC | C | PROCESS TIMER |

*FIG. 2B*

BIT 0  1 3 4    8 9                              35
IC | L/R | S | RFU | IC |

*FIG. 2C*

BIT 0  1 3 4    8 9              29 30      35
PTBR | L/R | S | PROG # | PAGE TABLE BASE | KEY |

*FIG. 2D*

BIT 0  1 3 4         10 11 12  14 15  19 20    35
CBBR | L/R | S | CBB2 | L/R | S | RFU | CBB1 |

⎣___SECONDARY CBB___⎦ ⎣___PRIMARY CBB___⎦

*FIG. 2E*

BIT 0  1 3 4    8 9                    24 25    35
PRIMARY CBB | L/R | S | RFU | CBB1 | 000 00000000 |

*FIG. 2F*

BIT 0  1 3 4    8 9            17 18 24 25     35
SECONDARY CBB | L/R | S | RFU | 000 0000 00 | CBB2 | 0000000 0000 |

*FIG. 2G*

FAIL SOFT MEMORY

The following patent applications filed in the U.S. Patent Office on an even date with the instant application and assigned to the same assignee as the instant application are hereby incorporated by reference to this application:

A. Processor for Input-Output Processing System invented by Marion G. Porter, et al., having Ser. No. 562,317 and filed in the U.S. Patent Office on 3/26/75, now U.S. Pat. No. 3,976,977.

B. Priority Interrupt Mechanism invented by Michael Monahan, G. Wesley Patterson and Jaime Calle having Ser. No. 562,315 and filed in the U.S. Patent Office on 3/26/75.

C. Dispatcher Mechanism invented by Michael Monahan and G. Wesley Patterson having Ser. No. 562,314 and filed in the U.S. Patent Office on 3-26-75.

D. Programmable Interface Apparatus invented by G. Wesley Patterson, Michael Monahan, W. Shelly and Jaime Calle having Ser. No. 562,364 and filed in the U.S. Patent Office on 3-26-75.

BACKGROUND OF THE INVENTION

1. Field of the Invention

This invention relates to data processing systems and more particularly to a general purpose computer system having alternate paths for addressing data in memory wherein one path is for normal addressing and the other is for automatic use in the event of memory failure.

2. Description of the Prior Art

As data processing systems have become more complex the size and number of processors, main memories and peripheral units has grown. It has therefore become imperative that communication links between processor, peripherals and main memory be maintained. Because of the high cost of providing redundant processors for controlling communications between peripheral units on input/output exchange was utilized for coupling a plurality of peripheral units to central processing unit. When this input/output exchange failed, access to the central processing unit by all peripheral units coupled to that input/output exchange was blocked. One answer to this dilemma was to provide redundant paths by providing at least one additional output exchange, to which all the peripheral controllers and peripheral units are connected. (See U.S. Pat. No. 3,792,448 issued Feb. 12, 1974 to Bennett et al and entitled "Fail Soft Peripheral Exchange".)

This did not solve the problem, however, where a peripheral itself such as a main memory failed. If, for example, there were a failure in one module or portion of main memory which stored the base addresses of routines or programs stored in the good portion of the main memory or module, these routines or programs in the good portion of the module would not automatically be accessible to the processor.

What is needed therefore is a mechanism for automatically providing an alternate addressing path to the good portion of memory.

OBJECTS OF THE INVENTION

It is an object of the invention to provide an improved memory addressing mechanism for an automatic data processing system.

It is another object of the invention to provide at least two addressing paths to data stored in a memory of a general purpose computer system.

It is still another object of the invention to provide a mechanism for detecting a memory failure in a general purpose computer system and automatically switching to an alternate memory.

Yet another object of the invention is to store addressing data in at least two different portions or modules of main memory and automatically utilizing the second module only when a failure is detected in the first module.

SUMMARY OF THE INVENTION

In accordance with the above and other objects of the invention, a firmware/hardware mechanism in a general purpose computer system automatically provides an alternate addressing path to a good portion of main memory when a failed memory portion is detected. Two types of memory failures are detected and an alternate addressing path to a good memory is automatically provided for each type of failure. The first type is a failure in a memory which is not detected by the memory hardware or the system interface unit SIU hardware; such a failure is handled by an exception processing mechanism to automatically provide an alternate addressing path to a good portion of main memory. The second type of failure is detected by memory or SIU hardware; such a failure is handled by an interrupt processing mechanism to automatically provide an alternate path to a good portion of main memory.

A primary and secondary control block base CBB register provides the redundant addressing. If the primary control block in memory cannot be accessed by utilizing the primary control block base CBB, firmware utilizing the secondary CBB automatically locates an interrupt or exception control block ICB or ECB respectively in another memory module which is utilized to initiate first an error routine to locate the error in the failed memory, and secondly a processing routine to provide the processing requested.

BRIEF DESCRIPTION OF THE DRAWINGS

FIGS. 2A through 2M are data structure diagrams of various registers utilized by the invention.

DESCRIPTION OF THE PREFERRED EMBODIMENT

Figure 1:
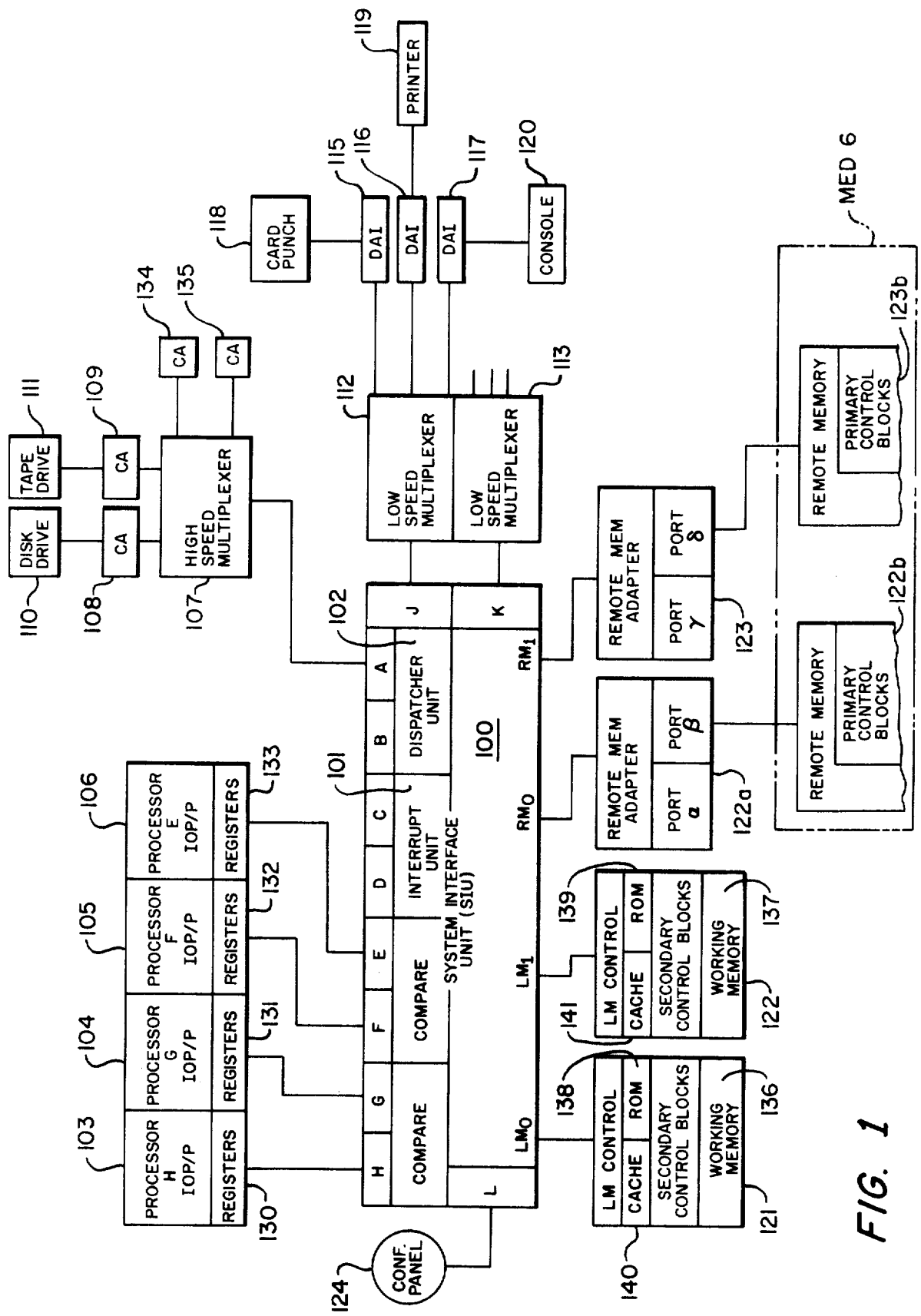
FIG. 1 is a schematic block diagram of a typical computer system utilizing the invention.

Referring now to FIG. 1 there is shown a typical computer system utilizing the invention. The System Interface Unit (SIU) 100, containing the priority interrupt and dispatcher unit mechanisms 101 and 102 respectively, provides connections between the elements of the computer processing system. In addition to providing for access of local or remote memory 121, 122 and 122a, 123 respectively by the active module processors 103-106, configuration panel 124 etc., the SIU 100 provides for direct addressing of the high and low speed multiplexors 107 and 112, 113 respectively and control adapters 108, 109, 134, and 135 by the processors 103-106.

The interrupt unit 101 and the dispatcher unit 102, are more fully described in references B and C above, they control the interrupt discipline and perform processor dispatching as required.

Each processor designated IOP/P 103-106 typically contains 16 registers 130-133 for each level of priority assigned to a process or a total of 128 registers per processor capable of storing 128 words. These registers 130-133 are sometimes referred to in this specification as the scratchpad memory and are more fully described infra. Each processor IOP/P is a general purpose computer processor with a conventional complement of register-register, register-memory, immediate, branch, bit field and shift instructions. These processors may be used as input/output processors (IOP) whose functions include initiation and termination of I/O command sequences, fetching, checking and translating channel programs, and direct control of low speed peripheral devices such as unit record and data communications equipment. Processors 103-106 are attached to and communicate with the SIU 100 via ports H, G, F, and E respectively.

The processor local memory 121, 122 interface with the SIU and the processors 103-106 via ports $L_{M0}$ and $L_{M1}$ and H-E respectively. Each of the local memories 121, 122 is organized as a read-write store 136, 137 respectively, plus read only memory ROM 138, 139 with an optional cache memory 140, 141. Width of the local memory interface $LM_0$, $LM_1$ is 36 bits plus 4 bits for parity. Local memory size is typically 256K or 512K bytes wherein each K is equal to 1024 bytes.

The remote memory adapters 122a, 123 are utilized when the SIU with its processors and peripherals is part of a larger general purpose computer system. The Remote Memory Adapters (REMA) 122a, 123 then provide a means of exchanging control and data transfers between the processors 103-106 and remote memories 122b and 123b, of another general purpose computer system designated 6XXX (not shown herein). Up to 2 ports $\alpha, \beta$ and $\gamma, \delta$ for each of the REMA units 122, 123 respectively are provided, each port having a 40-bit data path for input and for output between the computer system shown and described herein and a large computer system not shown herein, The REMA units 122a, 123 are connected and communicate with the SIU 100 via ports $RM_0$ and $RM_1$. Note that primary and secondary control blocks (to be more fully described infra) are stored in the local memories 121, 122 and remote memories 122b, 123b respectively.

A high speed multiplexor 107 provides direct control of data transfers between high speed peripheral devices (disk drive 110, tape drive 111) and central or local memory 121, 122. The high speed multiplexor 107 interfaces between the SIU and the peripherals via port A.

Each low speed multiplexor 112, 113 permits direct control by a processor 103-106 of a low-speed device such as card punch 118, printer 119 and console 120, via ports J and K and device adapter interface unit DAI 115, 116 and 117 respectively.

Referring now to FIGS. 2A-2L the general visible registers 2A are those processor registers which can be accessed with processor software instructions. The following constitute the visible registers of each processor IOP/P:

a. Process State Register (PSR)
   b. Instruction Counter (IC)
   c. Page Table Base Register (PTBR)
   d. General Registers (GR's)
   e. Control Block Base Register (CBBR)
   f. Process Control Register (PCR)

The PSR, IC, PTBR and GR's are held in scratchpad 328 of sixteen 36-bit registers and are assigned as shown in FIG. 2A.

Process State Register (PSR) FIG. 2B - The Process State Register holds information essential to the control of the current process. It has the format of FIG. 2B:

Steering Bits (0-7) — Steering inserted to identify interrupt source.
   P (Bit 8) — Privilege. Master (0) or Slave (1) Mode.
   R (Bit 9) — External Register. Certain predetermined non-IOP/P registers cannot be altered if this bit is set.
   A (Bit 10) — Address Mode. Absolute (0) or Paged (19 Mode.
   CC (Bits 11-12) — Condition Code. Meaning of the condition code is given for each IOP/P instruction. In general, correspondence is:

| | |
|---|---|
| Result = 0 | CC ← 0 |
| Result < 0 | CC ← 1 |
| Result > 0 | CC ← 2 |
| Overflow | CC ← 3 |

C (Bit 13) — Carry bit out of adder. Carry (1) or No Carry (0) resulting from execution of instructions using arithmetic functions of the adder. (Adds, substracts, multiply, divide, compare and negate.)
   Process Timer (Bit 14-35) — A timer which is decremented periodically while this process is active. A process timer runout exception occurs when the timer value reaches zero. The timer is decremented once every 512 processor cycles. For a cycle time of 80 nonoseconds, this results in a minimum value of about 40 microseconds, and a maximum value of 2.67 minutes.

Due to the frequency of access to the PSR, either for modification or reference, the actual value for the current process is held in a special register outside the general register scratchpad (not shown). For performance reasons, changes in the register are not reflected in general register $GR_0$. This scrachpad location assigned to the PSR is used only to safestore the current PSR value in the event of an interrupt.

All instructions which specify $GR_0$ as a destination operand will cause the result to be stored in the special register used to hold the PSR, and $GR_0$ will not be changed. A special instruction copies the PSR to a GR so that it may be used as an operand.

Instruction Counter (IC) FIG. 2C - The Instruction Counter holds the address of the current instruction. Since instructions must be half-word aligned, the least significant bit is always zero. The IC is held in general register $GR_1$, and it has the format of FIG. 2C:

L/R (Bit 0) — Local/Remote (0) Specifies Local memory 121, 122; (1) specifies Remote memory 122b, 123b.
   S (Bits 1-3) — Steering. Specifies which remote memory for remote memory references.
   RFU (Bits 4-8) — Reserved for Future Use.
   IC (Bits 9-35) — The (byte) address of the current instruction.

Page Table Base Register (PTBR) FIG. 2D - The Page Table Base Register points to the page table used to provide paged address relocation for the current process. It may be loaded only to master mode. The PTBR is held in GR15, and it has the format of FIG. 2D:

- L/R (Bit 0) — Local/Remote.
- S (Bits 1-3) — Steering.
- Prog. No. (Bits 4-8) — Program Number. A field which may be used by softward to carry additional program identification. This field is ignored by the processor hardware.
- Page Table Base (Bits 9-29) — This is the absolute address of the base of the table of Page Table Words for this process. Since the address is filled to 27 bits by adding six zeros at the right, page table addresses must be congruent to 0 mod 64 (bytes).
- Key (Bits 30-35)— The key is a process identifier used to associate Page Table Words with processes.

General Registers (GR) - The remaining 13 registers $GR_2 — GR_{14}$ of visible registers FIG. 2A are general registers. These may be used as source or destination operands, or as first or second-level address modifiers.

Figure 2H:
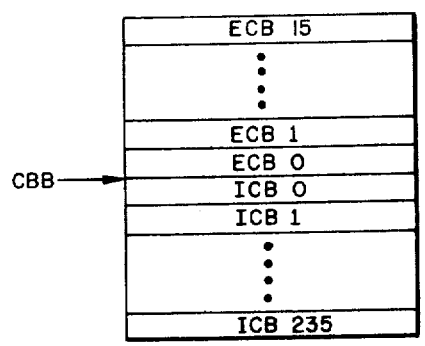
Figure 2I:
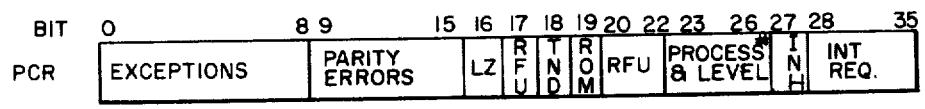
Figure 2J:
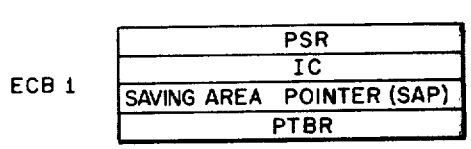

Control Block Base Register (CBBR) FIG. 2E - The Control Block Base (CBB) FIGS. 2F-26 is an absolute address which points to the base address in memory of the Exception Control Block (ECB) FIG. 2J and Interrupt Control Block (ICB) FIG. 2J tables.

The Control Block Base Register is actually held in the scratchpad location assigned to $GR_0$ for the highest priority process level. Two CBB values, a primary and a secondary are held in the register, which has the format of FIG. 2E.

The Primary CBB FIG. 2F is used for all exceptions, and for all interrupts except those associated with local memory errors. When used, the primary CBB is aligned as shown on FIG. 2F.

This alignment permits the location of bases of the ECB and ICB tables on any 512-word boundary in any memory Referring to FIG. 2F:
- L/R (Bit 0) — Local or Remote memory (Same as FIG. 2C). S (Bits 1-3) — Same as FIG. 2C.
- RFU (Bits 4-8) — Same as FIG. 2C.
- CBB1 (Bits 9-24) — Address of primary Exception Control Block or primary Interrupt Control Block.
- Bits 25-35 — Fill with zeros.

The secondary CBB FIG. 2G is invoked for interrupts due to local memory errors. When used, the secondary CBB is aligned as shown on FIG. 2G.

This alignment permits the location of the bases of the alternate ECB and ICB tables on a 512-word boundary within the first 64K of any memory.

Referring to FIG. 2G:
- L/R (Bit 0) — Local or Remote memory (Same as FIG. 2C).
- S (Bits 1-3) — Steering. Same as FIG. 2C.
- RFU (Bits 4-8) — Reserved for future use.
- Bits 9-17 — Fill with zeros.
- CBB2 (Bits 18-24) — Address of secondary Exception Control Block or secondary Interrupt Control Block.

The Exception Control Blocks and Interrupt Control Blocks are stored as shown on FIG. 2H with respect to the CBB. Note for the address of Interrupt Control Blocks ICB's relative to the CBB, the relative address of the ICB's is added to the CBB; whereas for the address of exception control blocks ECB's, their relative address is subtracted from the CBB.

Process Control Register (PCR) — There is one Process Control Register (PCR) common to all levels. It has the format of FIG. 2I.

- Exceptions (Bits 0-8) — Each bit indicates a non MME exception of a particular type.
- Parity Errors (Bits 9-15) — Identifies the point in the processor at which a parity error was detected.
- LZ (Bit 16) — No responses to level zero interrupt present.
- RFU (Bit 17) — Reserved for future hardware use.
- T&D (Bit 18) — T&D Mode (Test & Diagnostic) - Halt instruction stops processor with all interrupts ignored.
- ROM (Bit 19) — ROM bit. Controls access to Read Only Memory.
- RFU (Bits 20-22) — Reserved for future hardware use.
- PROC No. & LEVEL (Bits 23-26) — Processor number and priority level of process.
- INH (Bit 27) — Interrupt inhibit bit.
- INT. REQ. (Bits 28-35)— Interrupt request bits. Each bit set indicates a software set interrupt at a level corresponding to the bit position. Request level 7 (Bit 35) is always set. Processor set interrupts at levels 0-7 use ICB's 8-15 respectively.

Exceptions

Exceptions are processor-detected conditions which cause automatic entry to an exception processing routine. Exception conditions may be created deliberately, or they may be the result of a programming error or a hardware error outside the processor. Exception conditions are defined as shown below. For non-MME exceptions, correspondence is shown between type and bit positions of the PCR FIG. 2I.

| PCR Bit of Fig. 2I | Exception Type |
|---|---|
| 0 | Operation not complete (ONC). No response on ARA or ARDA from SIU. ARA - Active Request Accepted from SIU. SIU response to IφP/P cycle request. ARDA - Accept Read Data from SIU. |
| 1 | Page address bounds fault (Key check). |
| 2 | Page access fault. |
| 3 | Page not resident in memory. |
| 4 | Illegal operation (invalid instruction, illegal slave instruction, or illegal slave operation). |
| 5 | Process Timer run out. |
| 6 | Overflow if PSR CC=11, Divide Check if PSR CC=00. |
| 7 | Lockup fault (interrupts inhibited for more than 40 us). |
| 8 | Address misalignment. |

Exception conditions are identified by a four-bit exception number. For master mode entry exceptions, this number is taken from bits 10-14 of an instruction (not shown). In all other cases, the exception number is zero. The exception number is used as an Exception Control Block Number (ECB No.) to identify a four-word Exception Control Block (ECB) which points to the exception processing routine. The byte address of an ECB is given by ECB address = Control Block Base - 16 (ECB No. + 1).

The format of the ECB is shown on FIG. 2J. Referring to FIG. 2J, a PSR word FIG. 2B is held in the first word; an IC word FIG. 2C is held in the second word; a Saving Area Pointer (SAP) for processor pair 0 is held in the third word of ECB 0, and a SAP for processor pair 1 is held in the third word of ECB 1 FIG. 2H.

Before an exception processing routine can be entered, essential information about the current process must be safestored. This is performed as a part of the processor response to an exception. since occurrences of exceptions may be nested (i.e., a second exception may occur before completion of processing for the first), a stack is used to provide space for process safestore. The stack pointer is called the Saving Area Pointer (SAP), and it is held in the third word of ECB 0. Multiprocessor systems require a second stack, and the SAP for the second processor is held in the third word of ECB 1.

Figure 2K:
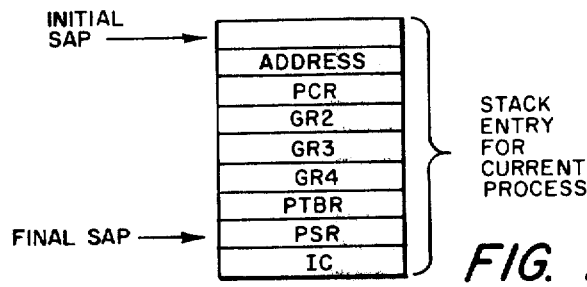

When an exception is detected, the appropriate Saving Area Pointer is retrieved, and information about the current process is safestored in the stack in the order shown on FIG. 2K where ADDRESS, IC, GR2-BR4, PCR, PTBR, PSR are defined supra. The Saving Area Pointer is updated accordingly.

The IC stored in the stack FIG. 2K points to the instruction following the one in process at the time the exception was detected. The address stored in the last stack location is the last address of interest generated before the exception was detected. It is primarily for exceptions involving addresses, including operation not complete, bounds, access and missing page exceptions.

After this information about the current process has been safestored in the stack 2K, the PSR, IC, and PTBR are loaded from the appropriate Exception Control Block, and the address of the Saving Area Pointer used by this processor is loaded into $GR_2$. This completes the entry to the exception processing routine.

Upon completion, the exception processing routine issues a special instruction (RMM) (not shown) to return to the process in which the exception was encountered. This instruction loads the PSR, IC, GR2, GR3, GR4, and the PTBR from the stack, and decrements the Saving Area Pointer. If exceptions and RMM instructions do not occur in pairs, the exception processing software must ensure that the stack is properly maintained. There are no checks for errors in software manipulation of the stack pointer, or for stack overflow or underflow of the stack pointer, or for stack overflow or underflow.

INTERRUPTS

Interrupts are events detected outside the processor which require a processor response. Interrupts in the IOP/P may be assigned to one of eight priority levels. Level 0 is the highest priority level, and level 7, the lowest. In order to minimize the time required to answer an interrupt request, the IOP/P provides a complete set of registers for each of the eight levels. When an interrupt causes the initiation of a new process, the current process is left intact in the registers assigned to the current level. Control may be returned to the interrupted process simply by reactivating that process level. The need to safestore and restore interrupted processes is eliminated, along with the accompanying overhead.

The sixteen registers for each level are held in successive 16-register blocks in the 128-word IOP/P scratchpad 328. Registers for level 0 are held in scratchpad locations 0-15. Since the PSR for level 0 is never transferred to the scratchpad (level 0 cannot be interrupted), scratchpad location 0 is used to hold the Control Block Base although other registers at level 0 would be used. Communication between registers at different levels is possible only via the master mode copy instructions (not shown) which address the scratchpad.

The IOP System Interface Unit (SIU) constantly monitors both the current process level of the processor and requests for interrupts from I/O system modules. Each interrupt request specifies the number pf the processor to be interrupted, the priority (level number) of the request, and steering to identify the interrupt requestor (see Interrupt word FIG. 2). This information is held in each module which may request interrupts, and for most modules it is set using programmable interface commands.

Whenever an interrupt request is present at a level higher than the current processor level, the SIU raises a higher level interrupt present line to the processor by providing an interrupt signal (see reference B supra). If several interrupt requests are present at the same level, the SIU determines which request is passed on to the processor on the basis of priorities established by port number.

Figure 2L:
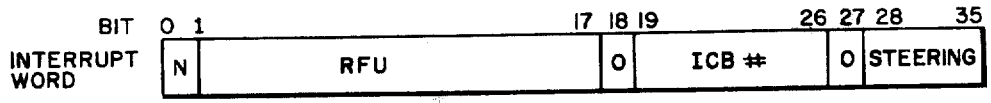

If the current process is not interrupt inhibited, an interrupt request causes the IOP/P to suspend the current process and to accept an interrupt word from the SIU. The interrupt word has the format of FIG. 2L. Referring now to FIG. 2L:

N (Bit 0) — new. This bit if set indicates that the interrupt is new one. If not set, the interrupt word specifies that of a previously interrupted process is to resume.

RFU (Bits 1-17) — Reserved for future use. This field must be 0 but will not be checked to ascertain that the field is 0.

Bit 18 — Set to 0.

ICB No. (Bits 19-26) — Interrupt Control Block Number.

STEERING (Bits 28-35) — Steering. This field identifies the interrupt requestor. Bits 28 to 31 are generated by the SIU and identify the source module (SIU port number) of the interrupt.

Figure 2M:
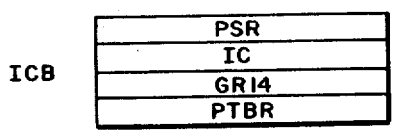

To initiate the interrupt processing routine, four registers are loaded from the interrupt control block FIG. 2M. When the PSR is loaded, the steering field from the interrupt word is inserted into the steering field of the PSR. The other registers, the IC, GR14, and PTBR, are loaded directly from successive-words in the ICB FIG. 2J.

A release instruction (not shown) (REL) is used to exit processes entered as the result of an interrupt. After a REL the SIU selects for execution the highest priority process waiting for the processor.

This process may be one that was previously interrupted, or a new process to be initiated as the result of an interrupt request. At the same priority level, previously interrupted processes have priority over new interrupt requests. Through hardware (see reference B supra) and software loading of the PCR, a processor may present to the SIU and interrupt at any level, 0-7. However, in order to provide a well-defined response to a REL executed at any level, the PCR bit requesting a level-seven interrupt is always set.

If a new process is to be entered as the result of a REL, the processor response is similar to that triggered by a normal interrupt, including acceptance of an interrupt word from the SIU and access to an ICB. If a previously interrupted process is to be re-entered, the SIU supplies only the level number and the fact that an old process is to be re-entered. Since the process state at the time of its interruption is intact in the register scratchpad, this is the only information required to restart the process.

General Description of Processor IOP/P

Figure 3:
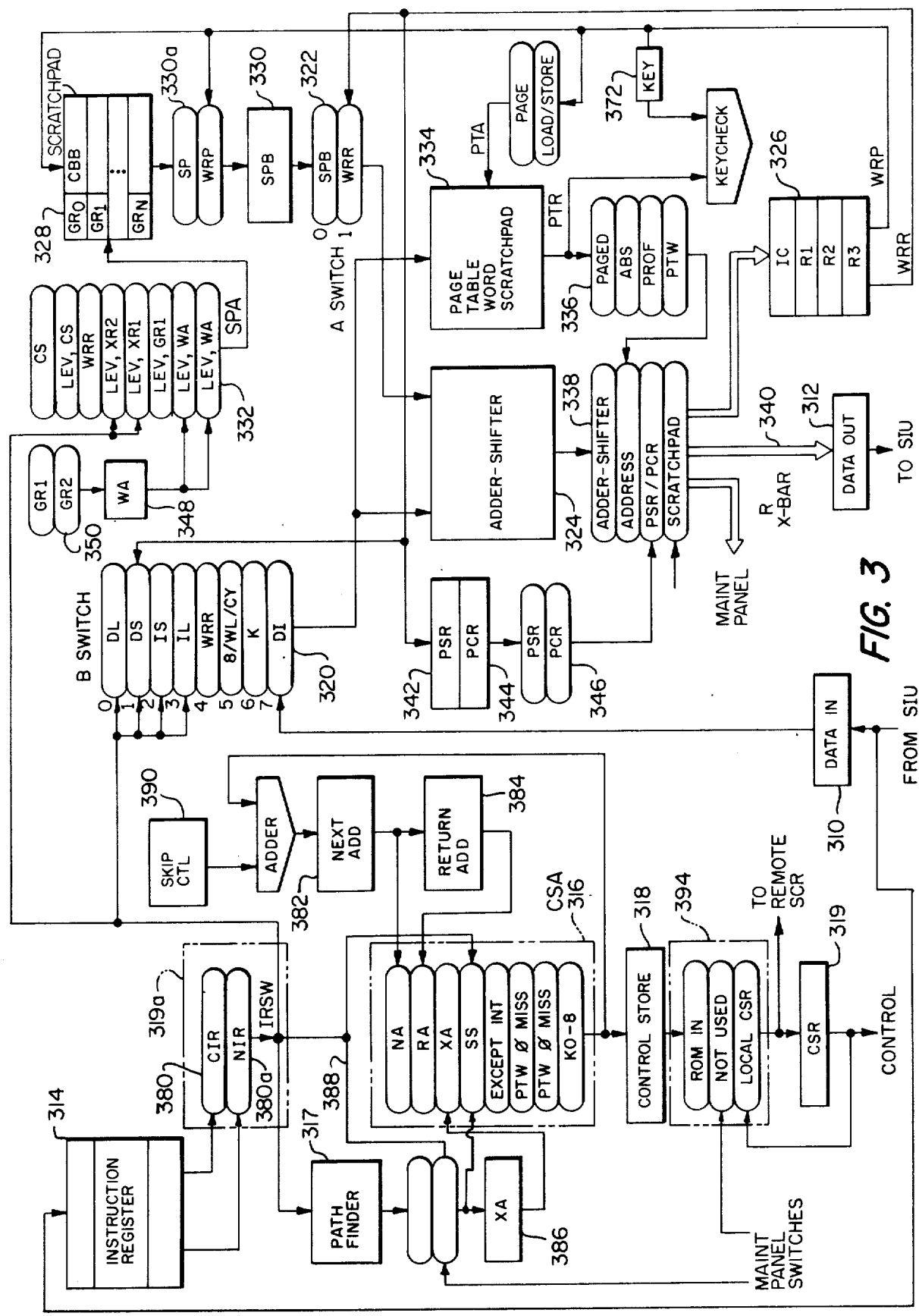
FIG. 3 is a block diagram of a processor in accordance with the invention.

FIG. 3 is a block diagram of a processor in accordance with the present invention. Data and instructions from the system interface unit (SIU) are provided at register 310 and processed data is provided to the SIU at data out register 312. As data and instructions are clocked into register 310 a parity check is made and parity errors are noted.

Instructions are placed in a "look ahead" dual readout register 314 which provides four words of buffering for instructions. An 8-level control store address switch 316 (which may typically be a multiplexor) provides an address to control store 318. (Data Selectors, typically are multiplexors and are well known in the art and commercially available. See The Integrated Circuits Catalog for Design Engineers published by Texas Instruments, pages 9-339 to 9-364.) Two levels of the CS switch 316 are provided by the instruction register 315 via pathfinder unit 317. The control store 318 contains the microinstructions which control data manipulations, and an addressed microinstruction is stored in control store register 319.

Data from input register 310 is loaded into one level of the eight-level "B" switch 320 (also commercially available) which, along with two-level "A" switch 322 (commercially available), provides operands for the adder/shifter network 324. The "B" switch 320 is controlled by a field in the control store register 319. "A" switch 322 provides inputs from the dual read-out working registers 326 or from general registers scratch pad 328 via SPB register 330. The dual read-out register 326 contains 3 working registers and an image of the instruction counter (IC) contained in the general register scratchpad 328. The WRR output from working register 326 is supplied to "A" switch 322, and the WRP output from general register 326 is supplied to the general register scratch pad 328. A seven-bit address for the general register scratchpad is generated in a one of eight switch (SPA) 332 (commercially available).

The adder/shifter network 324 which receives operands from "B" switch 320 and "A" switch 322 performs all of the arithmetic, logical, and shift operations required for address development and instruction execution.

A page table word (PTW) scratchpad 334 provides storage of 16 page table words for each of the 8 interrupt priority levels. The four-level address switch 336 (commercially available) concatenates addresses for either programmable interface commands or read/write memory cycles (either paged or absolute).

Output from the adder/shifter network 325 may be supplied through a four-level result crossbar (R-XBAR) 338 to data output register 312. The R-XBAR provides simultaneous transfer of its inputs to both the data output register 312 and the working registers 326. The R-XBAR also receives inputs from a process state register (PSR) 342, from a process control register (PCR) 344 thhrough switch 346, from the general register scratchpad 328, and from the address switch 336.

General Register Scratchpad

The General Register (GR) scratchpad 328 contains 128 forty bit registers. Each register consists of 4 nine bit bytes with a parity bit per byte. Data written into the scratchpad comes from one of the four working registers on the WRP output of the dual readout register bank used to implement the working registers. Registers included in the scratchpad are a process state register (PSR), an instruction counter (IC), a page table base register (PTBR), thirteen general registers (GR). The seven bit address for the scratchpad is generated in one of eight switch (SPA) 332. The switch control inputs are wired directly to the Control Store Output register (CSR) 319. The most significant three bits of the address define one of eight levels and the least significant four bits define one of sixteen registers within the level. The level is supplied by Active Interrupt Level (AIL) lines (not shown) from the SIU for six of the eight positions. The eight address sources are as follows:

0. Seven bits of the constant field (2-8) of the CSR which allows addressing any register in any level.
1. The AIL lines and four bits of the CSR constant field (5-8) which allows addressing any register in the current level.
2. The WRR output of the dual readout working registers bits 29-35. This allows a working register to provide the address for either initialization or software addressing (CSPG or CGSP).
3. The AIL lines and bits 19-22 of the current instruction. This provides the XR2 read address for second level indexing.
4. The AIL lines and bits 14-17 of the current instruction. This provides the XR1 read address for first level indexing or the GR/GR2 read address for operand access.
5. The AIL lines and bits 9-12 of the current instruction. This provides the GR1/GR read address for operand access.
6. The AIL lines and bits 0-2 of the Write Address (WA) register 48 with the least significant bit wired to logical one. This provides the odd address of an even odd pair read or write instruction.
7. The AIL lines and bits 0-3 of the WA register. This provides the address for all software writes into a GR at the current level. This included GR loads and returning execution results to the destination GR.

The output of the scratchpad goes to the one of two switch 330A into the SPB register 330 which is also an input to the Result Crossbar (R-XBAR) 340. The switch into SPB allows operations on a GR and a working register or on two working registers by loading one into SPB. The switch 330A into SPB 330 is controlled by the SP control field in the CSR 319.

The Write Address (WA) register 348 can be loaded from either bits 9-12 or 14-17 of the current instruction (see reference A supra). This provides the address for loading a General Register (GR) or returning a result to a GR. This is necessary since the GR address in the instruction being executed is no longer available out of the dual readout Instruction register once the IC is updated. The GR address is therefore saved in WA and used for the write operation by setting a Write (W) flip/flop (see ref. A supra) associated with WA. W resets on the first clock after it is set unless the WA control field in the CSR once again sets it (two word load of GR). a GR scratchpad write clock pulse is generated on all clocks occurring while W is set unless WA=0 in any mode or WA=15 or 1 in slave mode.

SPB register 330 is a forty bit register (four bytes with parity per byte). It provides buffering for words read out of the scratchpad and eliminates the scratchpad access time from the time required for an Adder/Shifter operation. Parity is checked on the data in the SPB register 330. The SPB load clock is controlled by the CSR SP control field 319.

A and B Operand Switches

The A and B operand switches provide the two operands for the Adder/Shifter network. A switch 322 selects either SPB or the WRR output of the dual readout working registers. The selection is controlled by a bit in CSR 319. However, the control is forced to select WRR if W is set and the address in WA is equal to XR1. This causes the new value of XR1 or GR2 to be used if the previous instruction modified them. The switch output is forced to logical zeros if the DL position is selected in B switch 20 and no indexing is called for (XR 1=0).

B switch 320 selection is controlled by a three bit field in CSR 319. However, the least significant bit is forced to logical one if the DL position is selected and second level indexing is required (bit 18 of the Instruction = 1. See reference A). The eight B switch positions are formatted as follows:

0. Bits 0-19 are equal to IRSW 319a bit 19. Bits 20-35 are wired to IRSW bits 20-35. This is the displacement field for either first level or no indexing.
1. Bits 0-23 are equal to IRSW bit 23. Bits 24-35 are wired to IRSW bits 24-35. This is the displacement field for second level indexing.
2. Bits 0-30 are equal to ITSW bit 8. Bits 31-35 are wired to IRSW bits 9-13. This is the short immediate value.
3. Bits 0-17 are equal to IRSW bit 8. Bits 18-35 are wired to IRSW bits 18-35. This is the long immediate value.
4. This position selects the WRR output of the dual readout working registers 322.
5. Bits 0-31 are euqal to logical zero. Bit 32 is equal to the most significant bit of the CSR constant field. This provides the number 8 for incrementing the instruction counter IC to point to the next even/odd Instruction pair (8 bytes) in memory. Bits 33 and 34 are equal to the word length in bytes of the current instruction if the two most significant bits of the CSR constant field are zero (10 for word and 01 for half word). Bit 35 is equal to the carry bit in the process state register PSR if the next to most significant bit of the control store register CSR constant field is one.
6. bits 0-26 are equal to zero. Bits 27-35 are wired to the CSR constant field.
7. This position selects the SIU Data In (DI) register.

Adder/Shifter Network

A detailed block diagram of the Adder/Shifter network is shown in FIG. 4 in the application of reference A supra. The Adder-Logical Unit (ALU) executes 36 bit arithmetic and logical operations. It also provides the transfer path for either the A or B operands to the R-XBAR at 338. The ALU operations are controlled by the ALU/Shift input bits in the CSR 319. The ALU mode is controlled by the least significant bit of the PSR/PCR control bits in the CSR. PTW Scratchpad The Page Table Word (PTW) scratchpad 334 provides storage for 16 PTW's for each of the eight levels (128 PTW's). The output of the B operand switch 320 provides the write data into the scratchpad and the write clock is controlled by a bit in the CSR.

The PTW scratchpad address is generated from either the least significant 7 bits of the WRP output of the working register 326, or the level and bits 21-24 of the WRP output. The first position is for initialization and general register GR to PTW transfer. The second position is for reading/loading PTW's while paging addresses and loading missing PTW's. The address selection is controlled by a bit in the CSR.

Each byte of the PTW output is parity checked. The PTW scratchpad output provides input data to two of the four address switch positions. If the PTW output is selected by the Paged position of the Address switch the following checks are made to determine if the PTW is valid (the priority of the checks for declaring faults is in the order shown):

1. Bits 30-35 of the PTW are compared to a Key register 372. (The key register identifies the process with which the PTW is associated and is loaded with bits 30-35 of WRP each time GR 15 is loaded.)
2. Bits 27-29 of the PTW are compared with bits 18-20 of WRP. This is to verify that the correct PTW is resident in this PTW Scratchpad location. (0, 16, 32, etc. all reside in the same scratchpad location.)
3. The next check is to see if the page is resident in read/write R/W memory 122b, 123b. A zero in PTW bit 6 indicates that the page is not resident in memory.
4. If the first three checks pass, bits 4-5 of the PTW are compared with the type of operation being initiated. A data read is always legal. An Instruction fetch requires bit 4 while a write requires bit 5.

If the PTW in the scratchpad fails any of the above checks, it will be accessed from the Page Table in R/W memory and checked again prior to causing an exception.

The address word for either R/W memory or the Programmable Interface is generated in the Address switch 336. The switch is controlled by the Address switch control bits in the CSR. If the paged position is selected and the PSR reflects the absolute address mode, the absolute position of the switch will be forced so that paging is bypassed. The four positions are as follows:

0. This position generates the paged address to R/W memory. Bit 0 equal to zero defines a R/W address. Bits 1-3 are provided by the ZAC bits in CSR. Bit 4 is equal to zero. Bits 5-8 are the zone bits and are generated as a function of the R/W memory operation. Reads cause zeros, word or double word writes cause ones, and byte writes cause a one in the byte position to be written. Bits 9-24 are equal to PTW scratchpad 9-24 which is the page base address. Bits 25-35 are equal to WRP 25-35 which is the page relative address. When this position is selected, the WRP output of the working registers must reflect the unpaged address.

1. This position generates the R/W memory address when no paging is required. It can be selected by the CSR or will be forced if position 0 is selected and the PSR reflects the absolute address mode. Bits 0-8 are the same as position 0. Bits 9-35 are equal to WRP 9-35 which must be equal to the absolute memory address when this position is selected.

2. This position generates a Programmable Interface (PI) command word. Bit 0 equal to one defines a PI command word. Bit 1 is supplied by the CSR ZAC field. Bit 2 is equal to bit 9 of the PSR and defines whether the current program can alter certain external registers. Bit 3 is equal to the processor number supplied by the SIU. Bit 4 is equal to zero. Bits 5-8 are equal to PSR bits 4-7 and define the port within the multiplexer. Bits 9-35 are equal to WRP' 9-35 and must be equal to the absolute address generated for either RDEX or WREX.

3. This position provides the path for reading a PTW from the scratchpad.

Bits 0-2 of the address switch 336 are modified to reflect the R/W memory steering during loading of absolute addresses into GR. This requires bits 0-2 to reflect PTW scratchpad 0-2 if paged and WRP 0-2 if absolute address mode. This would be enabled due to position 0 of the address switch being selected and no R/W memory cycle being initiated by the CSR SIU request type control bits.

The steering switch provides the SIU steering for either a R/W memory cycle of a Programmable Interface command. It is controlled by the Address switch control bits in the CSR. The steering is generated for R/W memory as follows:

Bit 0 — This bit equals 0 for R/W memory

Bit 1 — This bit defines local or remote memory. It is equal to PTW bit 0 if paged or WRP bit 0 if absolute.

Bits 2-4 — These bits are the memory steering bits. The initial value is equal to PTW bits 1-3 if paged or WRP bits 1-3 if absolute. This is also the final value if bit 1 defines remote memory. When bit 1 defines local memory, bits 2 and 3 define the local memory port and steer addresses to the ROM in the local memory controller. Bit 2 is equal to the Exclusive OR of the initial value and the Local Memory Port Specifier (LMPS) line from the SIU. Bit 3 is equal to the Exclusive OR of the PCR ROM bit if the initial value is zero.

Bit 5 — This bit defines a single or double word memory cycle. It is equal to bit 1 of the CSR ZAC field.

Bit 6 — This bit defines a read or write cycle. It is equal to bit 0 of the CSR ZAC field.

The steering is generated for a PI command as follows:

Bit 0 — This bit equals 1 for a PI command

Bits 1-4 — These bits define the SIU port to which the PI command is directed and equal bits 0-3 of PSR.

Bits 5-6 — These bits are the same as for a R/W memory cycle and are generated in the same way.

The outputs of the steering switch are clocked into the steering register at the SIU interface each time a memory cycle or PI command is initiated.

Result-XBAR

The Result Crossbar (R-XBAR) 338 provides simultaneous transfer of its inputs to both the Data Out and Working registers 312 and 326 respectively. A third output is wired to a display panel (not shown) and provides the path to display most of the IOPP registers. The output to the working register is controlled by the WR Write Address bits in the CSR and can select any of the four inputs. The ouput to the DO register 312 is controlled by the DO Write Address bit in the CSR and can select either the ALU/Shifter Output 324 the Address switch 336. However, this position is forced to select the PSR/PCR input if the DPCR line (not shown) from the SIU is activated.

0. ALU/Shifter Output switch
1. Address Switch
2. PSR/PCR Swtich
3. SPB Input Switch Working Registers The four working registers are contained in the dual readout register bank 326. Register 0 contains the current Instruction Counter (IC). (The IC is also maintained in the current level's GR1 of the GR scratchpad). Registers 1, 2 and 3 are working registers for instruction execution. They are labeled R1, R2 and R3.

The two Working register outputs are labeled WRP and WRR. WRP is used to access PTW's from the PTW scratchpad, R/W memory address generation and supplies the Working register input to both the GR scratchpad 328 and the SPB register 330. The register enabled out of WRP is controlled by the WRP bits in the CSR 314. WRR is used to provide operands to the A and B operand switches 322 and 320 respectively and the input to both the PSR and PCR registers. The register enabled out of WRR is controlled by the WRR bits in the CSR.

The Working registers can be loaded from any of the XBAR inputs. The register to be loaded and the write clock is controlled by the WR write address and Write WR bits in the CSR.

There is no restriction on the registers selected for the read and write operations. It can be three different registers or they can all be the same one.

The Process State register (PSR) 342 is kept outside the GR scratchpad since it is continuously monitored and updated. It is loaded from the WRR output of the Working registers 326. A write clock is generated for the PSR each time a master mode program loads GR0 (GR0 written using the WA address) or the PSR/PCR control bits in the CSR define a write PSR operation.

The entire PSR is loaded during a master mode load of GR0, execution of an Exception from the ECB, or the execution of a DSIP, MME, RMM or REL instruction (see Application of Ref. A). When an interrupt is executed, the steering from the Interrupt data word is inserted into the PSR data from the ICB prior to loading.

A condition code (cc), carry (c) and process timer are continuously updated. The cc is loaded each time an instruction is executed requiring a cc update. C is loaded with the carry out of the arithmetic and logic unit ALU each time the cc is loaded and the ALU is in the arithmetic mode. The process timer is decremented each time a Timer Ticker (not shown) rolls over. The Timer Ticker is an eight bit counter which counts on all system clocks (controlled clocks in step mode). The Timer Ticker is also used to detect an operation not complete or lock up exception as described in the section on exceptions.

The Process Control register (PCR) 344 is common to all levels. It is loaded from the WRR output of the working registers (not all bits are loadable). A write clock is generated for the loadable bits when the PSR/PCR control bits in the CSR define a write PCR operation.

Bits 18-19 and 28-34 are loadable. Bits 0-16 set when the defined condition occurs and are reset by the set/reset bit control in the CSR. Bits 23-26 are provided for software to read.

The PSR/PCR switch into the R-XBAR selects the corresponding register to be loaded into one of the working registers. This switch is controlled by the PSR/PCR control bits in the CSR but is forced to select PCR if the DPCR line (not shown) from the SIU is activated.

The dual readout register bank 314 provides four words of buffering for instructions. The current instruction read output (CIR) 380 and next instruction read output (NIR) 380a provide access to the entire instruction independent of the instruction length and address. This is provided through the Instruction register switch (IRSW) 319a. The CIR address is equal to the current Instruction Counter (IC) bits 32 and 33 which points to one of the four words. The NIR address is generated to point to the following word. IRSW 319a is controlled by the current bit 34 of the instruction counter IC which defines whether the instruction starts on a word or half word address. The two IRSW positions are therefore (0) CIR bits 0-35 and (1) CIR bits 18-35, NIR bits 0-17. IRSW bits 0-17 will reflect a half word instruction and IRSW bits 0-35 will reflect a full word instruction. The CIR and NIR addresses are updated each time the working register instruction counter IC is updated. All fields of the Instruction word must therefore be used prior to updating the IC.

The IR 314 is loaded each time a new value is loaded into the IC due to an interrupt, exception, branch, etc. or each time CIR address crosses over a two word boundary when the IC is updated by the current instruction length. The instruction access control is described below for the two conditions (1) enter new procedure and (2) incrementing through current procedure. In both cases the instruction fetches are double precision memory cycles and the addresses are paged unless the PSR defines absolute mode.

1. The double word instruction fetch is initiated and the IR write address loaded on the clock that pages (if required) the new value of IC. The IR write address is loaded with 00 if IC bit 32=0 or 10 if IC bit 32=1. (The CIR and NIR addresses are loaded when the new IC value is loaded). When the first word is available from memory, it is written into IR and the least significant bit of the write address is set. This causes the next memory word to be written into the second word of the pair (01 or 11). The IC value plus eight (bytes) is then used to initiate another double precision memory read using the paged (if required) address. The IR write address is updated to the next two words (10 if IC bit 32=0 or 00 if IC bit 32=1 and a test is made to see if instruction execution can begin or if execution must wait for the memory cycle to complete. The test is on bit 33 of the IC. If the test indicates the new procedure is being entered at the last half word of a two word pair (33 = 1), the instruction execution must be delayed until the data is available from the second double precision cycle to guarantee IR contains a full instruction word.

2. The execution of each instruction includes an update of the IC by that instruction's length. If this update causes the IC to pass over a two word boundary (old IC 32 ≠ new IC 32), the two word area of the IR that was just finished (old IC 32 value) can be loaded with new instructions. The new IC value plus eight (bytes) is then used to initiate a double precision memory read using the paged (if required) address. The IR write address is updated to point to the IR area available. When the two words are received, they are written into the two word area as described above.

Control Store Addressing and Sequencing

The Control Store Address is generated in the CSA switch 316. The first four positions of the CSA switch are controlled by the CSA switch control field in the CSR 319. The CSA switch control 316 can select the Next address register (NA) 382, the Return address register (RA) 384, the Execution address register (XA) 386, or the Standard Sequence output of the path finder (SS) 388. The Exception/Interrupt position is forced when either of these two conditions exist. The Exception address is reflected unless an Interrupt is being executed. The two PTW miss positions are forced when an PTW miss is detected. The constant position is selected when the Branch control field in the CSR calls for a branch to the constant address.

NA 382 is loaded on each execution clock by the sum of the CSA switch 316 output plus one plus a conditional skip constant 390. If no skip is called for by the CSR skip control field, NA is loaded with the address of the microinstruction immediately following the one being accessed (i.e., the clock that loads the microinstruction at address M into the CSR loads the address M+1 into NA). If a number of microinstructions are to be conditionally skipped, the CSR skip field can specify that a skip be executed with the CSR constant field defining the condition to be tested and the number (1 through 7) of microinstructions to be skipped. The sequence for a skip is as follows: microinstruction at M calls for a conditional skip, the execution of this microinstruction loads M+1 into the CSR and loads the address of M+1+1+SKP into NA. M is a location in Control Store 318. SKP=0 if the skip is not satisfied and equals the skip count defined in the least significant three bits of the CSR constant field if satisfied. The skip is inhibited if position 4, 5 or 6 is selected in the CSA switch.

The conditions that can be tested for skip execution are defined by bits 3-5 of the CSR constant field. WRR 35, WRR 0, WRR 33 and the carry bit in PSR need to be tested for zero or one. The PSR cc field will be tested for zero, one, two or three. Bits 1-2 of the constant field are used to define the test. The conditions to be tested are as follows:

0. WRR 35=K2 if K1=1 (K0-K8 are equal to bits 36-44 of CSR 319). WRR 0=K2 if K1=0
1. Carry bit in PSR=K2

2. WRR 33-34=K1-2
3. Address syllable (AS) with IRSW 18=0
4. PSR cc field has corresponding bit in IRSW CF field
5. PSR cc field=K1-2
6. IRSW 7=WRRO if K1=0 IRSW 7=K2 if K1=1
7. Higher Level Interrupt or Level Zero Present line from SIU if K2=0. Level Zero Interrupt Present line from SIU if K2=1.

The RA register 384 is loaded from the NA register 382 whenever the Load RA bit is on in the CSR.

The XA register 386 is loaded with the Pathfinder 317 output each time the SS position is selected in the CSA switch. The use of the Pathfinder will be described below. Its output is 2 control bits and 16 address bits. The address is used to address the upper 256 words of Control Store (address bit zero is forced to 1 in the XA position of the CSA switch).

The execution of a software instruction is in two phases. The first phase is a microinstruction sequence common to a group of instructions. The second phase is a microinstruction sequence (which is only one microinstruction in most cases) unique to the specific software instruction being executed. After completing the sound phase, the common phase of the next instruction would be entered (in some cases, the second phase may return to the first phase via RA register 384 for a few additional common steps prior to entering the next instructions common phase).

The operation code of IRSW 219a provides the Pathfinder address. The Standard Sequence output of the pathfinder is the Control Store address of the start of the microinstruction sequence common to the group of instructions containing this one. (This sequence is referred to as a standard sequence SS). SS is the Standard Sequence output 388 of the pathfinder. The location in the Pathfinder addressed by the operation code contains the SS address and the address in Control Store where the unique sequence for this instruction starts. The instruction is then executed by branching to the Standard Sequence addres, executing the common steps, branching to the unique sequence address in XA register 386, executing the unique steps, updating the Instruction Count (IC) so that the next instructions operation code is enabled out of IRSW and repeating the above sequence by branching to the new Standard Sequence.

The interrupt answering, exception processing and PTW missing sequence are entered by forcing the corresponding position to be selected in the CSA switch 316. Interrupts are executed at the completion of software instructions. If the Higher Level Interrupt Present (not inhibited) or the Level Zero Present lines from the SIU are active when the SS position of the CSA switch is selected by the CSA switch control bits in the CSR, the CSA switch control logic is forced to select the Exception/Interrupt position. This casues the interrupt answering sequence to be entered rather than the next instructions standard sequence. (The Exception/Interrupt position reflects the address of the interrupt answering sequence at this time).

Missing Page Table Words (PTW) cause immediate entry into the PTW missing sequences. Either the operand or instruction missing position is forced by the CSA switch 316 control logic during the clock period immediately following the paging step. The return from either sequence is to the standard sequence decoded from IRSW 319a. This causes the instruction that was being executed to be started over again. Therefore, the microprogram will not do anything prior to the PTW missing detection that can't be done again. A flip/flop (not shown) is set when the PTW miss is detected that stays set until the address is once again paged. A miss the second time through causes an exception as defined below.

The exceptions fall into two categories. The first type causes an immediate entry into the exception processing sequence. The second type does not affect the CSA switch 316 control logic until the next instructions standard sequence is entered. Both types cause the Exception/Interrupt position in the CSA switch 316 to be selected and set the corresponding bit in the PCR register 344.

The first category of exceptions are operations not complete, Page faults, Page not resident, and illegal instructions. They all must be serviced as soon as they are detected since continuation of instruction execution is impossible. The second category is process timer run out, overflow, lockup fault and address misalignment. Divide check is handled by a test and branch if divisor is zero. They all indicate faults but do not need to be immediately serviced and can wait until the start of the next instruction.

Control Store Output Register

The Control Store Output register (CSR) 319 contains the microinstruction being executed. Provision is made for a remote CSR register, as indicated.

There is a one of four position switch 394 supplying the input to CSR. The four positions on the CSR input switch are as follows:

0. 1. These positions are the inputs from the ROM chips on the Control Store substrates.
2. This position is the input from the maintenance panel.
3. This position reflects the local CSR. It is used to reload the remote CSR bits when the maintenance panel switches are used to display data.

Data is displayed in the I/O System by simulating CSR with maintenance panel switches. When the switches are enabled out of the CSR input switch 394, a signal is generated causing the remote CSR bits to be loaded with the microinstruction simulated by the switches. The old contents must be reloaded when the display of the registers is completed. This is accomplished by selecting position 3 for one clock prior to switching back to position 0 and reloading the remote CSR bits during the one clock period. (A block diagram of the input to the local and remote CSR is shown in Application of Reference A supra in FIG. 3 with the timing diagram for reloading the remote CSR after using the maintenance panel switches for display).

The format of CSR is as follows:

| | |
|---|---|
| Bit 0 | Clock NA into RA |
| Bit 1 | Execute SKIP (K1-2=test, K3-5=condition, K6-a=skip count) |
| Bit 2 | Branch to K0-8 |
| Bits 3-4 | WR write address |

-continued

| | |
|---|---|
| | 00=write IC (Load WA if Write WR) |
| | 01=write R1 (set W if Write WR and CSA=SS) |
| | 10=write R2 |
| | 11=write R3 |
| Bit 5 | Wait for Accept Read Data from SIU |
| Bits 6–7 | X-BAR address for WRW output |
| | 00=Adder/Shifter Output switch |
| | 01=Address switch |
| | 10=PSR/PCR switch |
| | 11=SP Output switch |
| Bits 8–9 | Condition Code (CC) Control |
| | 00=NOP |
| | 01=Load Arithmetic |
| | 10=Load Logic |
| | 11=Load Parity of SPB Least Significant Byte |
| Bit 10 | Write PTW Scratchpad |
| Bits 11–13 | ZAC for R/W memory cycle (bits 1–3 of R/W address switch positions 0 and 1) |
| | 0 X X=Read |
| | 1 X X=Write |
| | X 0 X=Single precision |
| | X 1 X=Double precision |
| Bit 14 | Set/Reset bit defined by CSR41-44 |
| Bits 15–17 | SIU Request Type |
| | 000=NOP |
| | 001=Interrupt Data |
| | 010=Release and Interrupt Data |
| | 011=Memory or Programmable Interface Data (PI if 19-20=10) |
| | 100=Byte Read to Write (Byte address, R/W Zone if write) |
| | \* 101=Instruction Fetch |
| | \* 110=Instruction Fetch if CIR0=IRW0 |
| | \*\* 111=Instruction Fetch if SKIP test satisfied or if CSR1=0 |
| Bit 18 | PTW Scratchpad address |
| | 0=Extended Read/Write from WRP |
| | 1=Current level PTW Read/Write from Effective Address. |
| Bits 19–20 | Address Switch Control |
| | 00=Paged address (control logic forces 01 if PSR 10=1) |
| | 01=Absolute address |
| | 10=PI address |
| | 11=PTW scratchpad 0–35 |
| Bit 21 | Write WR |
| Bits 22–23 | CSA switch control (first four positions) |
| | 00=Next address register (NA) |
| | 01=Return Address register (RA) |
| | 10=Execution Address register (XA) |
| | 11=Standard Sequence Address |
| Bits 24–25 | WRR read address |
| Bits 26–27 | WRP read address |
| | 00=IC |
| | 01=R1 |
| | 10=R2 |
| | 11=R3 |
| Bit 28 | A operand Switch |
| | 0=SPB |
| | 1=WRR |
| Bits 29–30 | PSR/PCR control & ALU Mode |
| | 00=Read PSR or Logical Mode |
| | 01=Read PCR or Arithmetic Mode |
| | 10=Write PSR |
| | 11=Write PCR |
| Bits 31–32 | Adder/Shifter Output switch |
| | 00=Shifter |
| | 01=ALU |
| | 10=Store 32 |
| | 11=Load 32 |
| Bits 33–35 | B Operand switch |
| | 000=DL |
| | 001=DS |
| | 010=IS |
| | 011=IL |
| | 100=WRR |
| | 101=8, Word length, or Carry |
| | 110=Constant K0-8 |
| | 111=DI |
| Bits 36–44 | Constant K0-8 |
| | This field is also used for mutually exclusive control. |
| Bits 36–37 | 8/WL/CY control |
| | 00, 8/WL/CY=IRSW Instruction word length |
| | 01, 8/WL/CY=PSR Carry Bit |
| | 10, 8/WL/CY=8 |
| Bits 36–38 | Shift Count Switch control |
| | 000 Left shift |
| | 001 Right shift |
| | 010 CSR Shift Count (39–44) |
| | 011 Instruction F1 field |
| | 100 Instruction F2 field |
| | 101 Instruction F3 field |

| | -continued |
|---|---|
| | 110 Byte load |
| | 111 Byte Store |
| Bits 39–44 | CSR Shift Count |
| Bits 36–44 | CSA switch branch address |
| Bits 37–38 | SKIP test value for conditions tested for multiple values |
| Bits 38 | WA input switch Control (0=GR1 1=GR2) |
| Bits 39–41 | SKIP test condition |
| | 000 WRR35=CSR38 if CSR 37=1 |
| |     WRR0=CSR38 if CSR 37=0 |
| | 001 PSR 13 (carry)=CSR38 |
| | 010 WRR33=CSR38 |
| | 011 IRSW 14-35 Contains Address syllable and bit 18-0 |
| | 100 BRAC CF field has bit corresponding to PSR CC if CSR38=1 |
| | BRAC CR field does not have bit corresponding to PSR CC if CSR38=0 |
| | 101 PSR CC field=CSR37=38 |
| | 110 IRSW7=WRR0 if CSR37=0 |
| |     IRSW7=CSR38 if CSR37=1 |
| | 111 SIU HLIP line active and not inhibited or LZP active. |
| Bits 42–44 | SKIP count |
| Bits 38–44 | GR scratchpad total address |
| Bits 41–44 | GR scratchpad address per level |
| Bits 41–44 | Set/Reset bit address |
| | 0000 Reset Halt Mode |
| | 0001 Set Halt mode |
| | 0010 Reset Inhibit Interrupt mode |
| | 0011 Set Inhibit Interrupt mode |
| | 0100/0101 Reset PCR Exception Storage |
| | 0110/0111 Not Defined |
| | 1000/1001 Invert D0, Steering, and interrupt Data Parity |
| | 1010/1011 Invert GR Parity & inhibit GR SP write clock conditionally |
| | 1100/1101 Inhibit GR SP write Clock conditionally |
| | 1110/1111 Set Measure F/F |
| Bits 45–48 | ALU Control/Shift Input switches Control |
| Bits 45–48 | ALU operation (CSR 30=mode) |
| Bits 45–46 | Left Shift Input switch |
| | 00 A Operand switch |
| | 01 Sign of Right Shift Input Switch |
| | 10 Zeros |
| | 11 Ones |
| Bits 47–48 | Right Shift Input switch |
| | 0X Zeroes |
| | 10 B Operand switch |
| | 11 A Operand switch |
| Bits 49–50 | GR Scratchpad Control |
| | 00=NOP |
| | 01=Write GR scratchpad |
| | 10=Load SPB from GR scratchpad |
| | 11=Load SPB from WRP |
| Bits 51–53 | GR Scratchpad Address |
| | 000=CSR scratchpad total address (CSR38–44) |
| | 001=CSR scratchpad address per level (AIL, CSR41–44) |
| | 010=Extended Read/Write address from WRR |
| | 011=Current level XR2 |
| | 100=Current level XR1 |
| | 101=Current level GR1 |
| | 110=Odd register of pair addressed by WA in current level |
| | 111=WA address in current level |

\* These codes cause an instruction PTW missing sequence if a page fault is detected.
\*\* This code causes an operand PTW missing sequence if a page fault is detected.

Control Store

The control store 318 is a typical prior art read only memory ROM well known in the art. The theory, construction and use of ROM's is detailed in a book by Samir S. Husson entitled, "Microprogramming Principles and Practices" published by Prentice Hall in 1970. The microprogram which resides in the control store 318 and controls the operations of the invention is included in the Appendix of this specification! When the control store 318 is microprogrammed as shown in the Appendix, it is termed the firmware of the invention. The firmware differs from a software program in that an actual physical operation is performed on the ROM chip, and removal from the computer or loss of power does not alter the microprogram; this is akin to hardwiring the program in the computer. However, with software programming there is no physical alteration of memory — merely electrical, hence loss of power or removal of the memory from the computer destroys the program; there is no kinship to hardware logic.

OPERATION OF THE INVENTION

Basically there are two failures where the fail soft memory invention is utilized. The first are processor detected conditions which are herein termed exception conditions and cause an automatic retry to an exception processing routine. The second type of failures are events detected outside the processor which require a processor response and are herein termed interrupts. Exception conditions have been discussed supra under exceptions and interrupts are discussed in detail in the application of reference B supra. Once an exception or interrupt condition has been identified each is handled by a combination of hardware/firmware in almost identical fashion. The main difference in handling aside from the nomenclature is that in address formation for the interrupt control block ICB relative to the control block base CBB the interrupt control block number ICBN is added to the CBB address; whereas in address formation for the exception control block ECB the exception control block number ECBN is subtracted from the CBB address. (See FIG. 2H and also discussion supra under the sections on Exceptions and Interrupts).

For purposes of illustration as to the operation of the invention, assume that an interrupt has been generated by the SIU. (See application in reference B supra for such generation). The SIU constantly monitors both the current process level of the processor and requests for interrupts from the I/O system modules. Each interrupt request specifies the number of the processor to be interrupted, the priority (level number) of the request and the steering to identify the interrupt requestor. This formation is held in each module which may request interrupts, and for most modules it is set by using programmable interface commands. (See application entitled, Programmable Interface Apparatus by G. Wesley Patterson, Michael Monahan, W. Shelly and Jaime Calle, filed on an even date with this application and assigned to the same assignee as the instant application Reference D supra). Whenever an interrupt request is present at a level higher than the level of the current processor, the SIU raises a higher level interrupt present line to the processor by providing an interrupt signal. If several interrupt requests are present at the same level, the SIU determines which request is passed on to the processor on the basis of priorities established by port number. If the current process is not interrupt inhibited, an interrupt request causes the IOP/P to suspend the current process and to accept an interrupt word, FIG. 2L, from the SIU. Among other pieces of information the interrupt word supplies is an interrupt control block number ICBN as bit positions 19-26. This is the number that is added to the CBB1 address of the primary control base CBB to obtain an interrupt control block ICB address. If this were an exception instead of an interrupt, the exception control block number ECBN is then subtracted from the CBB1 address of the primary control block base CBB. The address is formed by harware under firmware control. (See U.S. Pat Application Ser. No. 562,230 entitled Method of Generating Addresses to a Page Memory filed on an even date with this application and assigned to the same assignee). Interrupt processing firmware causes the access of the CBB1 address stored in the primary CBB in general register GR0 of 1 and 0 (although any other level could be utilized for the purposes of this invention). The firmware will then cause the primary control block base to be shifted left by 11 bits so as the format of FIG. 2F is obtained. The ICBN bits 19-26 of interrupt word FIG. 2L are added to the CBB1 address of primary CBB FIG. 2F to obtain the address of the interrupt control block ICBB. A double word request is then made by the firmware to access the first two words in the interrupt control block FIG. 2J. Following the access of the first two words in the interrupt control block, the operation not complete ONC bit (which is bit 0 of the PCR) is tested to see whether or not the prior operation was completed or not. If the prior operation was completed and the ONC bit is not set, then the normal interrupt processing routine is initiated by loading the process registers with the four registers from the interrupt control block. When the PSR is loaded, the steering field from the interrupt word is inserted into the steering field of the PSR. The other registers, the IC, the GR14 and PTBR are loaded directly from successive words in the ICB.

Assuming however that the ONC bit, bit 0 of PCR, is set, then there is an indication that there is a malfunction in memory and an alternate memory should be used. Accordingly, the interrupt processing firmware once again causes the access of the CBB from GR0 of 1 and 0 in the scratch pad 328. However, this time the secondary control block base is formed and CBB2 which uses an alternate memory is utilized to access another interrupt control block ICB to handle the memory fault in the primary memory. The address of the secondary interrupt control block ICB is formed under firmware control by taking the bits 0-3 of CBBR and place them in bits 0-3 of working register 326. Also bits 4-10 of the CBBR are placed in bit positions 18-24 of the working register. This forms the secondary CBB of FIG. 2G. By using the CBB2 address and the new port identified by the steering and adding it to the interrupt control block number, an alternate interrupt control block can then be accessed and the system does not fail.

The microinstructions for the firmware for performing these processes are shown in the Appendix herein. In order to further illustrate their use in greater detail, the exception processing which is similar to the interrupt processing above will now be described. An exception is caused as previously described herein under the section on Exceptions. Exceptions are recognized by the processor and identified by a four bit exception number. For master mode entry exceptions, the exception number is taken from bits 10-14 of an instruction (not shown herein). In all other cases, the exception number is 0. The exception number is used as an exception control block number ECBN to identify a four-word exception control block ECB FIG. 2J. As previously described under the section on Exceptions, this ECBN is subtracted from the CBB address to obtain the ECB address. (See application entitled Method of Generating Addresses to a Page Memory by Wesley Pattason and Marion G. Porter, filed on the same date as the instant application and assigned to the same assignee named herein and having U.S. application Ser. No. 562,230).

Before an exception processing routine can be entered, essential information about the current process must be safe stored. This is performed as part of the processor response to an exception. Since occurrences of exceptions may be nested a stack, FIG. 2K, is used to provide space for process safe store. In the exception control block ECB there is stored a saving area pointer SAP which points to the stack used to provide space for safe storing information about the current process. Accordingly, the firmware is entered at address 200 on page 43 of the Appendix. (Note that these are octal addresses). From address 200 on page 43 there is a branch to address 435 on page 56 of the Appendix herein. At address 435 there is the microinstruction which is a call to form the address in order to get the SAP. There is then a branch to address 100 on page 37 where there is a microinstruction which tests the processor number to see whether a saving area pointer for processor pair P0 or processor pair P1 is required.

(See application of reference B supra for description of processor pair P0 and processor pair P1). The alignment of the CBB is effected by a microinstruction at octal address 103 on page 37. This instruction controls the alignment of the primary CBB by causing a left shift of 11 bits to give the format of the primary CBB FIG. 2F. Microinstruction at octal address 106 causes a read of the saving area pointer SAP addressed. Following the access of the SAP, the ONC bit in the PCR is tested to see whether or not the access was completed. The test for the operation not complete at the completion of a memory cycle is performed under control of microinstruction at octal address 110. If the operation was completed, it indicates that there was no timing out or failure of memory and accordingly a normal exception procedure is entered under control of microinstructions 111 and 112. However, if the ONC bit is set, it indicates that the operation was not completed due to a memory time out or some other malfunction and microinstruction at octal address 112 is skipped and microinstruction at octal address 113 on page 38 of the Appendix is executed. The secondary control block base CBB2 is then generated from the control block base register CBBR, FIG. 2E, under control of firmware microinstructions at octal addresses 113, 114, 115, 116, 117 and 120 found on page 38 of the Appendix. Utilizing this secondary control block base CBB2 a second address in another memory for the exception control block is generated utilizing the principles of address formation described in patent application supra entitled Address Formation. Accordingly, the system is not shut down because of a memory failure.

Having shown and described a preferred embodiment of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. A fail soft mechanism in a general purpose computer system having at least one processor, said fail soft mechanism for automatically providing an alternate addressing path for addressing data in a second portion of main memory when a failure is detected in a first portion of main memory, said mechanism comprising:
   a. first means for addressing a first control block means in a first portion of main memory of said computer system, said first means further comprising:
      1. a first interrupt control block addressing means for storing signals indicating a first part of the address of the first control block means in said first portion of said main memory;
      2. a first control block addressing means for storing signals indicating a second part of the address of said first control block means in said first portion of said main memory; and,
      3. a first combining means coupled to be responsive to said first interrupt control block addressing means and to said first control block addressing means for combining the first part and second part of the address of said first control block means;
   b. second means coupled to be responsive to said first means, for detecting a failure in the first portion of main memory addressed by said first means; and,
   c. third means, coupled to be responsive to said second means, for automatically providing an alternate path to a second portion of main memory upon detection of a failure in said first portion of main memory, said third means further comprising;
      1. a second interrupt control block addressing means for storing signals indicating a first part of the address of a second interrupt control block means in said second portion of said main memory;
      2. a second control block addressing means for storing signals indicating a second part of the address of the second interrupt control block means in said second portion of said main memory; and,
      3. second combining means coupled to be responsive to said second interrupt control block addressing means and to said second control block addressing means, for combining the first and second part of the address of the second interrupt control block means in said second portion of said main memory.

2. The fail soft mechanism as recited in claim 1 wherein said processor is executing instructions of a current process and further including fourth means coupled to said second means for generating signals interrupting said processor when a failure in the first portion of main memory addressed by said first means is detected.

3. The fail soft mechanism as recited in claim 2 including fifth means responsive to said second combining means for generating signals for developing in said main memory a stack address, said stack for storing information about the currently executing process to permit returning to the currently executing process upon the termination of the interruption of said processor.

4. In a data processing system having at least one processor sequentially executing instructions of a first one of a plurality of processes each of said processes having a priority level based on the relative importance to the other of said processes, and with any of said processes requesting control of said processor, said data processing system having at least one local random access memory and one random access main memory, a fail soft mechanism for automatically providing an addressing path to said main memory when a failure is detected in said local memory, said fail soft mechanism comprising:
   a. first means for providing an interrupt signal when a higher priority process than said first one of said plurality of processes requests control of said processor;
   b. second means, coupled to be responsive to said first means, for detecting said interrupt signal;
   c. third means, coupled to be responsive to said second means for addressing a first predetermined portion within the local memory of said computer system said third means further comprising;
      1. a first interrupt control block addressing means for storing signals indicating a first part of the address of said first predetermined portion of said local memory;

2. a first control block addressing means for storing signals indicating a second part of the address of said first predetermined portion of said local memory; and,
3. first combining means coupled to be responsive to said first interrupt control block addressing means and to said first control block addressing means for combining said first and second part of the address;

d. fourth means, coupled to be responsive to said third means, for detecting a failure in said local memory; and, e. fifth means, coupled to be responsive to said fourth means, for automatically providing an alternate addressing path to said main memory, said alternate addressing path comprising;
1. a second interrupt control block addressing means for storing signals indicating a first part of the address of a predetermined portion of said main memory;
2. a second control block addressing means for storing signals indicating a second part of the address of said predetermined portion of said main memory; and,
3. second combining means coupled to be responsive to said second interrupt control block addressing means and to said second control block addressing means for combining the first and second part of the address of said predetermined portion of main memory.

5. In a data processing system having at least one processor sequentially executing instructions of a first one of a plurality of processes each of said processes having a priority level based on the relative importance to the other of said processors, and with any of said processes requesting control of said processor, said data processing system having at least one local random access memory and at least one random access main memory, said at least one local random access memory having a first predetermined portion for storing instructions of a predetermined second process of said group of processes, and said at leasst one random access main memory having a second predetermined portion for storing instructions of said predetermined second process of said group of processes, said second process stored in said local and main memory for handling exceptions detected by said processor, a fail soft mechanism comprising:

a. a first addressing path further comprising;
1. first means for storing first coded signals representing the absolute address, within said local memory, of a third portion of local memory, said third portion of local memory for storing a plurality of groups of second coded signals, a predetermined first group of said group of second coded signals for indicating the address of said first predetermined portion of said local random access memory;
2. second means for storing third coded signals representing the relative address within said third portion of local memory of said predetermined first group of said group of second coded signals within said third portion of local memory; and,
3. third means coupled for being responsive to said first and second means for combining the first and third coded signals whereby the absolute address within said local memory of the predetermined one of said plurality of second coded signals is generated;

b. a second addressing path comprising;
1. fourth means for storing fourth coded signals representing the absolute address, within said main memory, of a fourth portion of said main memory, said fourth portion of main memory for storing a plurality of groups of fifth coded signals, a predetermined first group of said group of fifth coded signals for indicating the address of said second portion of said main memory;
2. fifth means for storing sixth coded signals representing the relative address within said fourth portion of main memory of said predetermined first group of said plurality of groups of fifth coded signals within said fourth portion of main memory; and,
3. sixth means coupled for being responsive to said fourth and fifth means for combining the fourth and sixth coded signals whereby the absolute address within said main memory of the predetermined one of said plurality of fifth coded signals is generated;

c. seventh means coupled to be responsive in said third means for storing coded signals for indicating said second addressing path is to be utilized when said first addressing path is defective.

6. The fail soft mechanism as recited in claim 5 including eighth means coupled to be responsive to said seventh means for generating a first sequence of signals for causing said second addressing path to be used in accessing instructions in said second process.

7. The fail soft mechanism as recited in claim 6 wherein a fifth portion of said main memory stores coded signals indicative of the status of said first one of said plurality of processes when it is interrupted, and further including ninth means addressed by said fourth means for storing coded signals for indicating the address of said fifth portion of main memory.

8. The fail soft mechanism as recited in claim 7 including tenth means coupled to be responsive to said seventh means for generating a second sequence of signals for causing signals representing the status of said first one of said plurality of processes to be safestored in said fifth portion of main memory.

9. In a data processing system having a plurality of processors coupled to an interface unit via predetermined processor communication channels each processor being selectively controlled by selected ones of a first group of processes, each processor having a plurality of registers accessible to any of the processes, each processor further having at least one local memory, said data processing system also having a plurality of main memories coupled to said interface unit via predetermined memory communication channels for communicating with each other and with said processors, each communication channel having an address identified by a predetermined steering code, each process and each peripheral channel being associated with a predetermined level of priority, said system interface unit having an interrupt mechanism for interrupting said selected ones of said first group of processes, said data processing system further having monitoring means for monitoring interrupt request signals from a plurality of a second group of processes requesting control of said processors, a fail soft mechanism comprising:

a. a first addressing path further comprising;

1. a first interrupt control block in a first one of said main memories, said first interrupt control block for storing first coded signals indicating the address of first interrupt handling process in said main memory;
2. a first interrupt register for storing second coded signals indicating a first partial address of said first interrupt control block in said first one of said main memories;
3. a first primary control block register for storing third coded signals indicating a second partial address of said first interrupt control block in said first one of said main memories;
4. a first combining means coupled to be responsive to said first interrupt register and to said first primary control block register for combining the second and third coded signals, whereby the whole address of said first interrupt control block in said first one of said main memory is generated;

b. a second addressing path further comprising:
1. a second interrupt control block in a second one of said local memories, said second interrupt control block for storing fourth coded signals indicating the address of a second interrupt handling process in said local memory;
2. a second interrupt register for storing fifth coded signals indicating a first partial address of said second interrupt control block in said second one of said local memories;
3. a second primary control block register for storing sixth coded signals indicating a second partial address of said second interrupt control block in said second one of said local memories;
4. a second combining means coupled to be responsive to said second interrupt register and to said second primary control block register for combining the fifth and sixth coded signals whereby the whole address of said second interrupt control block in said second one of said local memories is generated;

c. first means is said first addressing path for storing seventh coded signals indicating whether or not said first addressing path is defective.

10. The fail soft mechanism as recited in claim 9 including second means coupled for being responsive to said first means for generating first control signals causing said first addressing path to be utilized in addressing said first interrupt handling process, when said seventh coded signals indicate said first address path is not defective.

11. The fail soft mechanism as recited in claim 10 including third means in said first interrupt control block for storing eighth coded signals indicating the address in said first one of said main memories of a first stack.

12. The fail soft mechanism as recited in claim 11 including fifth means responsive to said second means for generating second control signals causing predetermined information pertinent to said selected one of said first group of processes to be stored in said first stack.

13. The fail soft mechanism as recited in claim 9 including sixth means coupled for being responsive to said first means for generating third control signals causing said second addressing path to be utilized in addressing said second interrupt handling process, when said seventh coded signals indicate said first addressing path is defective.

14. The fail soft mechanism as recited in claim 13 including seventh means in said second interrupt control block for storing ninth coded signals indicating the address in said second one of said local memories of a second stack in said second one of said local memories.

15. The fail soft mechanism as recited in claim 14 including eighth means responsive to said second means for generating fourth control signals causing predetermined information pertinent to said selected one of said first group of processes to be stored in said second stack.

* * * * *

UNITED STATES PATENT OFFICE
CERTIFICATE OF CORRECTION

PATENT NO. : 4,010,450
DATED : March 1, 1977
INVENTOR(S) : Marion G. Porter, Garvin W. Patterson & Jaime Calle It is certified that error appears in the above-identified patent and that said Letters Patent are hereby corrected as shown below:

In the Abstract, line 10, delete "systen" and insert "system".

In the Abstract, line 14, delete "systen" and insert "system".

Column 30, line 3, delete "is" and insert "in".

Signed and Sealed this

Twenty-first Day of June 1977

[SEAL]

Attest:

RUTH C. MASON
Attesting Officer

C. MARSHALL DANN
Commissioner of Patents and Trademarks